United States Patent
Pearl

(10) Patent No.: US 7,335,893 B2
(45) Date of Patent: Feb. 26, 2008

(54) METHOD AND DEVICE FOR ALIGNING A CHARGED PARTICLE BEAM COLUMN

(75) Inventor: Asher Pearl, Rehovot (IL)

(73) Assignee: Applied Materials Israel Limited, Rehovot (IL)

( * ) Notice: Subject to any disclaimer, the term of this patent is extended or adjusted under 35 U.S.C. 154(b) by 128 days.

(21) Appl. No.: 10/492,257

(22) PCT Filed: Oct. 4, 2002

(86) PCT No.: PCT/IB02/05792

§ 371 (c)(1),
(2), (4) Date: Aug. 30, 2004

(87) PCT Pub. No.: WO03/032351

PCT Pub. Date: Apr. 17, 2003

(65) Prior Publication Data

US 2005/0006598 A1  Jan. 13, 2005

Related U.S. Application Data

(60) Provisional application No. 60/328,452, filed on Oct. 10, 2001.

(30) Foreign Application Priority Data

Jul. 29, 2002  (EP) .................................. 02016839

(51) Int. Cl.
*H01J 37/26* (2006.01)

(52) U.S. Cl. ................ 250/396 R; 250/310; 250/491.1

(58) Field of Classification Search ............ 250/396 R, 250/310, 491.1, 398
See application file for complete search history.

(56) References Cited

U.S. PATENT DOCUMENTS

| 4,162,403 A | 7/1979 | Baumgarten |
| 4,451,737 A | 5/1984 | Isakozawa |
| 4,618,766 A | 10/1986 | van der Mast et al. |
| 5,258,617 A | 11/1993 | Toshikatsu et al. |
| 5,359,197 A | 10/1994 | Komatsu et al. |
| 5,627,373 A | 5/1997 | Keese |
| 6,067,164 A | 5/2000 | Onoguchi et al. |
| 6,441,384 B1 * | 8/2002 | Kojima ................ 250/492.23 |

(Continued)

FOREIGN PATENT DOCUMENTS

EP   1 202 320 A2   5/2002

(Continued)

OTHER PUBLICATIONS

International Search Report, dated Jun. 3, 2003, for PCT/IB02/05972.

(Continued)

*Primary Examiner*—Kiet T. Nguyen
(74) *Attorney, Agent, or Firm*—Patterson & Sheridan, LLP

(57) ABSTRACT

The invention provides a method for automatically aligning a beam of charged particles with an aperture. Thereby, a defocusing is introduced and a signal calculated based on an image shift is applied to a deflection unit. Further, a method for correction of astigmatism is provided. Thereby, the sharpness is evaluated for a set of frames generated whilst varying the signals to a stigmator.

34 Claims, 6 Drawing Sheets

U.S. PATENT DOCUMENTS 6,552,340 B1 * 4/2003 Krivanek et al. ............ 250/310
6,583,413 B1 * 6/2003 Shinada et al. ............. 250/310
2005/0012050 A1 * 1/2005 Shemesh ................. 250/491.1

FOREIGN PATENT DOCUMENTS

| JP | 63-307652 | 12/1988 |
| JP | 2000-077018 | 8/1998 |
| JP | 10-092345 | 10/1998 |
| JP | 2001-068048 | 3/2001 |
| JP | 2001-084934 | 3/2001 |

OTHER PUBLICATIONS

International Preliminary Examinaton Report, dated Aug. 11, 2003, for PCT/IB/05972.

European Search Report for EP Application No. 02016839.9, filed Mar. 6, 2006.

* cited by examiner

METHOD AND DEVICE FOR ALIGNING A CHARGED PARTICLE BEAM COLUMN

CROSS-REFERENCE TO RELATED APPLICATIONS

This application claims benefit of United States provisional application No. 60/328,452, filed Oct. 10, 2001, which is incorporated by reference herein. This application is also related to United States patent application Ser. No. 10/492,574, filed Oct. 4, 2002.

FIELD OF THE INVENTION

The present invention generally relates to charged particle columns and more particularly to a method and an apparatus for the generation of images to align a charged particles beam column. More specifically, the present invention relates to an automatic alignment of a beam of charged particles and automatic correction of aberrations.

BACKGROUND OF THE INVENTION

Technologies like microelectronics, micromechanics and biotechnology have created a high demand in industry for structuring and probing specimens within the nanometer scale. On such a small scale, probing or structuring is often done with electron beams, which are generated and focussed in charged particle beam devices like electron microscopes or electron beam pattern generators. Charged Particle beams offer superior spatial resolution compared to e.g. photon beams due to their short wavelengths.

The spatial resolutions that could possibly be achieved based on wavelength e.g. less than 0.01 nm is, however, limited due to intrinsic aberrations and misalignments of the beam of charged particles leading to a decrease of resolution.

For example, in a scanning electron microscope (SEM) the beam is focused to a small spot having a size around 10 nm or smaller. The beam is scanned over a specimen. Thereby, the resolution of the images obtained is limited by the beam diameter in the plane of the sample surface.

The beam diameter can be limited by aberrations, for example chromatic aberrations that are independent of the alignment of the beam but depend on the energy variance of the electron beam. Further, there are spherical aberrations that are produced by non-zero apertures of the imaging lenses. However, aberrations can be made worse or can even be introduced by a misalignment of the beam with respect to the optical axis of the individual imaging element. Thus, one of the most important parameters for optimizing the resolution and, thereby, the imaging quality is the alignment of the optical column. Since the high spatial resolutions require very small tolerances, alignment of the beam with respect to individual optical elements has to be conducted on a regular basis.

Conventionally an alignment of a charged particle column has to be performed by an operator. Thereby, an operator adjusts the respective signals applied to an alignment correction devices based on images measured. One disadvantage of this procedure is that it is dependent on the judgment of the operator. Thus, inaccuracies and variations from one operator to the other are introduced. Further, the manually adjustments are time consuming which is particularly disadvantageous for online inspection systems requiring a high system throughput.

In document U.S. Pat. No. 5,627,373 a method for automatically aligning an electron beam axis to an objective lens axis in a scanning electron microscope is described. Thereby, an image of a specimen at a first and at a second point of focal range of the objective lens is measured. For each image an indication signal of a position of a straight edge within the field of view of the microscope is generated. After an image translation is detected from the two signals and alignment is automatically adjusted, the procedure is repeated in an orthogonal direction. The complete operating sequence is repeated in iterations until the image shift occurring due to the misalignment is less than a predetermined threshold.

Further, a method for automatically correcting electron beam astigmatism in a scanning electron microscope is suggested in document U.S. Pat. No. 5,627,373. For astigmatism correction, border portions are sampled about the entire specimen circumference at a 30° interval. An axis of beam distortion is identified upon the indication signals of sharpness among the samples. The distortion is adjusted along such axis and improved in iterations.

Document U.S. Pat. No. 6,025,600 teaches a method for calculating and correcting an astigmatism error in charged particle beam systems. Images are collected during a single sweep of the objective lens settings of the charged particle system. Different orientations of image features, such as lines in a stigmation target, are analyzed. Optimum sharpness or best focus values are obtained as a function of the objective lens settings. Appropriate changes to the settings of the astigmatism correctors are computed by taking a linear combination of optimum sharpness values associated with the different orientations of image features.

In document U.S. Pat. No. 6,067,167 a scheme for realizing the automatic adjustment of the electron optics system in an electron optics device such as scanning electron microscope is described in which a prescribed number of images sequentially obtained by the electron optics device at sequentially adjusted focus points due to a changing refractive index of an objective lens are stored. A moving amount of a sample image is calculated. Thereby, a judgment of whether an adjustment is necessary or not is based on the calculated moving amount and an adjustment is conducted if needed. Further, a scheme for realizing the astigmatism correction in a charged particle beam optical system of an electron optics device such as scanning electron microscope is disclosed.

However, there are further problems related to the alignment of a charged particle beam column and the improvements presented within the prior art needs further perfectioning especially when online inspection systems or online beam writers are considered.

SUMMARY OF THE INVENTION

The present invention intends to overcome some of the above problems. According to an aspect of the present invention, a method for fast generation of images to align a charged particle beam column as specified in independent claim 1 and a charged particle beam device as specified in independent claim 32 is provided.

Further advantages, features, aspects and details of the invention are evident from the dependent claims, the description and the accompanying drawings.

According to the present invention, it is advantageous to have a fast and efficient automated alignment of the column. Thereby, even for each wafer or each site of a wafer, the beam of charged particles can be aligned. Thus, the following drawbacks related to prior art can be overcome. For example, within the prior art, iterative adjustments of respective misalignments are suggested. Thereby, even for an automated adjustment of a beam of charged particles, the behavior of an operator adjusting the system is imitated. This imitation of the iterative procedure of an operator might improve alignment times to some degree, but the time necessary to adjust a charge particle system will still be in the range of 5 to 10 seconds. This is especially true, since in the prior art it is taught to vary the focus by changing the current of the objective lens. The objective lens, however, is often built in the form of a magnetic or magnetic-electrostatic lens. Thus, the self-inductance of the coils inhibits a fast variation of the focus and, thereby, delimits a further improvement of the time necessary for the adjustment of the beam of charged particles.

According to a further aspect of the present invention, there is provided a method to generate images used to automatically optimize the imaging quality of a charged particle column. This method comprising the steps of: introducing a chromatic aberration within the objective lens by a variation of a potential influencing the beam of charged particles, whereby a variation of a focus is obtained; and generating a set of images during the defocusing of the beam.

As already mentioned above, the usage of a potential influencing the beam energy to defocus the beam of charged particles by introduced chromatic aberrations enables a decreased alignment time. Introducing chromatic aberrations in the context of this invention is to be understood as varying chromatic aberrations. Thus, the focal length is varied based on an introduced variation of chromatic aberrations.

Preferably, the steps of measuring an image translation caused by the defocusing and aligning the beam of charged particles with respect to the optical axis based on the image shift measured, is included.

Advantageously, a further step is conducted according to the invention. The sharpness of the set of images is evaluated to obtain the beam energy corresponding to a desired focus. Thus, the focus with respect to the surface of the specimen can automatically be adjusted by setting the beam energy to a desired value.

Further, it is preferred to evaluate the sharpness of the set of images with respect to at least two different directions to obtain at least one correction signal for a stigmator correcting a beam distortion and correct for the beam distortion.

According to the above two advantages, it is possible to use the set of images to adjust several parameters optimizing the imaging quality with one set of images that have been imaged. Thus taking into account, in addition to the measurement time, some time for the calculations, the beam of charged particles can be aligned within about 0.5 to 1 seconds. Therefore, an automated focusing, and at least an automated alignment with respect to the optical axis can easily be performed for every site of every wafer and thus steady imaging conditions can be obtained.

According to a preferred aspect of the present invention, the sensitivity of shifting the beam of charged particles with respect to the optical axis is calibrated at least once, whereby the calibration is based on the image shift of at least one set of images generated during calibration.

Further, it is preferred to calibrate at least once, a sensitivity of correcting the beam distortion of the beam of charged particles, whereby the calibration is based on the sharpness evaluation of the at least one set of images generated during calibration.

Advantageously, all procedures aligning the position of the beam with respect to the optical axis and correcting for a distortion of the beam are conducted in two directions. It is even more preferred to use these procedures in the two directions independently. According to this, it is advantageous if the two directions are substantially orthogonal or at an angle of 45°.

According to a further aspect of the present invention there is provided a method for the automatic generation of images to align a charged particle beam column which comprises the steps of: introducing a chromatic aberration by a variation of the energy of the beam of charged particles, whereby a variation of a focus is obtained; generating a set of images, while the energy of the beam of charged particles is varied; evaluating the sharpness of the set of images in at least two different directions; and applying a correction signal to a stigmator so that it corrects a beam distortion.

According to a further aspect of the present invention there is provided a method for the automatic generation of images to align a charged particle beam column which comprises the steps of: introducing a chromatic aberration by a variation of the energy of the beam of charged particles, whereby a variation of a focus is obtained; generating a set of images, while the energy of the beam of charged particles is varied; measuring an image shift; and correcting the position of the beam of charged particles with respect to an optical axis based on the image shift measured.

According to a further aspect of the present invention there is provided a method for automatically aligning a charged particle beam to the optical axis of a charged particle beam column which comprises the steps of: introducing a chromatic aberration by a variation of a potential influencing the energy of the beam of charged particles within the objective lens, whereby a variation of a focus is obtained; scanning the beam of charged particles over a specimen to generate a set of images, while the energy of the beam of charged particles is varied; measuring an image shift between at least two different images of the set of images; calculating a correction signal based on the image shift; and applying the correction signal to the deflection unit so that the beam is aligned with the optical axis.

The invention is also directed to an apparatus for carrying out the disclosed methods and including apparatus parts for performing each described method steps. These method steps may be performed by way of hardware components, a computer programmed-by appropriate software, by any combination of the two or in any other manner. Furthermore, the invention is also directed to methods by which the described apparatus operates. It includes method steps for carrying out every function of the apparatus.

BRIEF DESCRIPTION OF THE DRAWINGS

Some of the above indicated and other more detailed aspects of the invention will be described in the following description and partially illustrated with reference to the figures. Therein:

FIGS. 5a and 6b illustrate the principle of a two-ramp analysis for evaluating the sharpness of images;

DESCRIPTION OF THE PREFERRED EMBODIMENTS

Initially, it should be appreciated by those skilled in the art that the present invention can be used with any charged particle device. However for convenience, the invention will be described with respect to its implementation in a scanning electron microscope (SEM). Those skilled in the art would also appreciate that all discussions herein related to voltages and potentials refer to relative and not absolute terms. For example, accelerating the beam by connecting the cathode to "ground" and applying 3 kV to the sample is equivalent to applying negative 3 kV to the cathode and placing the specimen on ground. Therefore, while for convenience some discussion is provided in terms of specific voltages, it should be understood that the reference is to relative potential.

Figure 1:
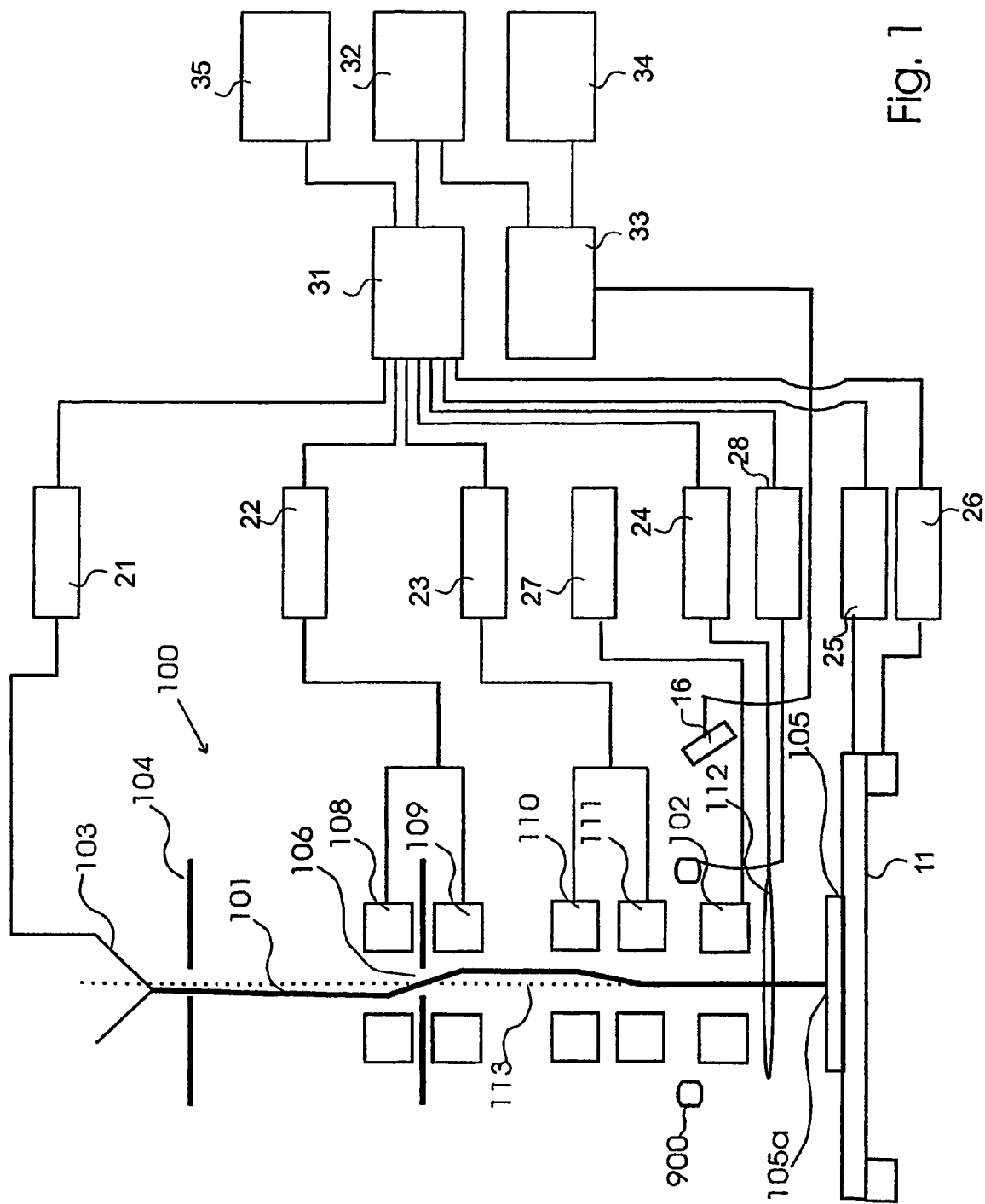
FIG. 1 shows a block diagram of a charged particle beam device suitable to conduct the various aspects of the present invention.

A block diagram of an electron microscope is shown schematically in FIG. 1. The electron microscope 100 comprises an electron gun 103 emitting an electron beam 101, which is extracted by the anode 104. The objective lens 112 focuses the electron beam on the specimen surface 105a. In order to obtain an image from the entire field of view, the beam is scanned over the specimen using the scanning deflection unit 102. An alignment of the beam to the aperture 106 or the optical axis 113 respectively can be achieved by the deflection units 108 to 111. As a deflection unit coils, electrostatic modules in the form of charged plates or a combination of coils and electrostatic deflectors can be used. An image is formed within a scanning electron microscope (SEM) by detecting backscattered or secondary electrons with a detector 16 and synchronizing the detected signal with the scanning of the electron beam. Thus during a measurement, an image or one or several frames are generated by generating measurement data. In general, the data is at least stored in an intermediate or buffer memory to be evaluated during further steps. The images can also be stored on any appropriate storage device to be evaluated after several or all images have been generated. Appropriate storage device can, for example, be hard disks, permanent storage devices or RAM.

A secondary product of major importance to examination or to the image formation of specimens are secondary electrons that escape from the specimen 105 at a variety of angles with relatively low energy (3 to 50 eV). These secondary electrons reach the detector 16 and are detected. By scanning the electron beam 101 over the specimen 105 and displaying/recording the output of the detector 16, an image of the surface of the specimen 105a is formed.

The different parts of the apparatus are connected to corresponding supply units, the high voltage supply unit 21, the gun alignment deflection control unit 22, the aperture alignment deflection control unit 23, the scanning coil supply unit 27, the objective lens supply unit 24, the stigmator control (and current supply) unit 28, the specimen voltage supply unit 25 and the stage supply unit 26, which are controlled by the parameter adjustment unit 31. The parameter adjustment unit 31 is connected with the standard setting unit 35 and the analyzing and/or synchronization control unit 32, which provides a basic set of parameters to the parameter adjustment unit 31.

Within this application, the phrase "charged particle beam column" refers to all kind of devices wherein a beam of charged particles has to be aligned. This could be an electron microscope, an electron beam writer or corresponding devices using ions. An aperture, as referred to within this application, can be a beam defining aperture or an aperture incorporated to separate different vacuum chambers. Preferably however, the phrase aperture refers to the final aperture of a charged particle beam column. If not mentioned otherwise e.g. in a specific embodiment, beam deflection fields and beam deflection units are understood to be electrostatic, magnetic or magnet-electrostatic. Such units could be realized in the form of biased plates, coils or a combination thereof. Measurements of scattered or secondary corpuscles from a specimen can be conducted with detectors in the form of scintillators connected to photomultiplier tubes or the like. Since the way of measuring the signals does not influence the inventive idea in general, this is not to be understood as limiting the invention.

Further within this application, the word frame is used as a single scanning of the field of view of the charged particle beam device. Thereby, an image is obtained. An image, in general however, can be obtained by e.g. averaging more than one frame. In addition, filter functions or the like can be applied to obtain the final image.

Furthermore, within this application, changing the energy of the beam of charged particles includes all changes of potentials within the charged particle beam column that influence the charged particle velocity within the objective lens or the energy the charged particle impinges on the sample. Thus, an accelerating voltage within the gun could be varied. Yet, the energy of the beam could also be varied by changing any other potential, such as an aperture potential, a specimen potential or a beam boost potential or the like that influences the focusing properties of the objective lens. The change of the energy of the beam is, within this application, also referred to as "wobble" or "wobbling" similar to the phrase used for a periodical defocusing making use of a lens current, as known from the operator-supported alignment.

Further, it is to be understood that within this application the phrase "evaluate" also refers to calculations of an algorithm, which is e.g. used by a computer.

Thereby, aperture alignment deflection units 110 and 111 are used to align the electron beam 101 to the optical axis 113. The phrase "aperture alignment" is used since the aperture can alternatively be mechanically moved to align the electron beam 101 to the optical axis. For the embodiments describe within this application, two deflection units 110 and 111 are used. Thus, the beam tilt introduced in the first deflection unit 110, can be corrected for in the second deflection unit 111. Due to this double deflection system, the electron beam can be shifted in one direction without introducing a beam tilt of the electron beam with respect to the optical axis. Thus, it is possible to shift the beam onto the optical axis. FIG. 1 shows this deflection system for one direction. The electron beam is shifted onto the optical axis with respect to the x-direction, as indicated in FIG. 1.

The present invention is to be understood with respect to an alignment of the electron beam with the optical axis as a two-dimensional beam shift. Thus, it is advantageous that the alignment described above is conducted in a second direction. Adjusting both directions, x and y, the electron beam is aligned to the optical axis. This second direction should at least differ from the first direction. The second direction is preferably orthogonal to the first direction. Thus, the alignment procedure in x-direction is preferably also conducted in y-direction. Due to the independence of the two directions, the alignment steps can be conducted independently of each other, as long as a beam tilt is not taken into account. For the alignment in y-direction, a third and fourth alignment deflection unit are advantageously located such that a corresponding deflection in a second direction can be realized.

Figure 2A:
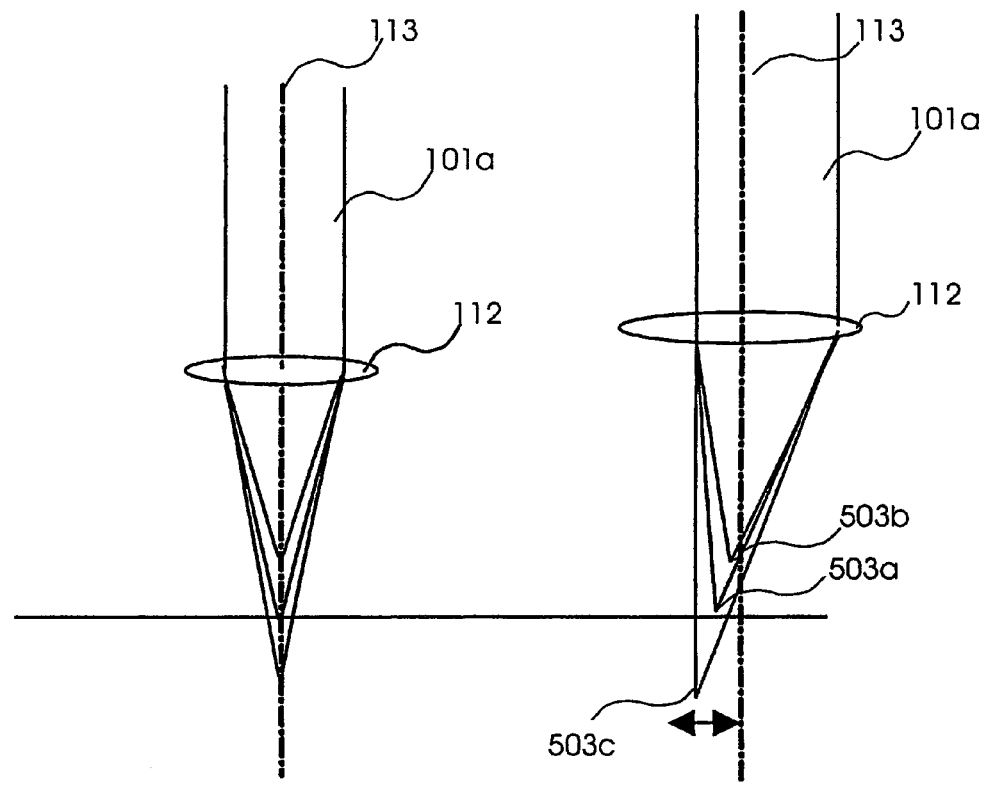
FIGS. 2a and 2b show the principle of aperture alignment; it is illustrated how a misaligned beam introduces a translation of the generated image.
Figure 2B:
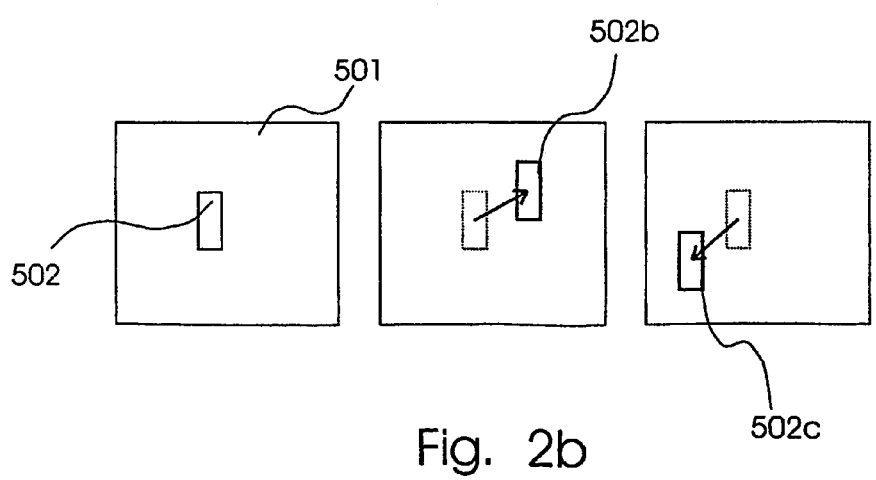

One embodiment to align electron beam 101 with the electron microscope 100 shown in FIG. 1 is described with respect to FIGS. 2a, and 2b. Objective lens 112 focuses the electron beam 101 on the specimen. Electron beam 101 has previously been formed by apertures and condensor lenses. Since objective lens 112 is mainly responsible to achieve the final spot size, which limits the resolution, the beam has to be accurately aligned to the objective lens. In general, the objective lens defines an optical axis.

The principle whether or not the beam is accurately aligned can be better understood with respect to FIG. 2a. On the left side, an electron beam 101a is outlined that is symmetrically aligned with respect to optical axis 113. In case a defocusing is purposely induced, the focus moves in a perpendicular direction to the plane of a specimen. The respective image impression obtained if measurements are conducted during a defocusing will be the following. A feature of an image will be pictured in focus and out of focus. However, the image will not be translated since the focus of electron beam 101a only varies in a direction perpendicular to the specimen surface. Only a blurring of the image or corresponding image features will be experienced. Based on an evaluation of the sharpness, which will be described in more detail below, the focus giving the best imaging results can be calculated.

Figure 5A:
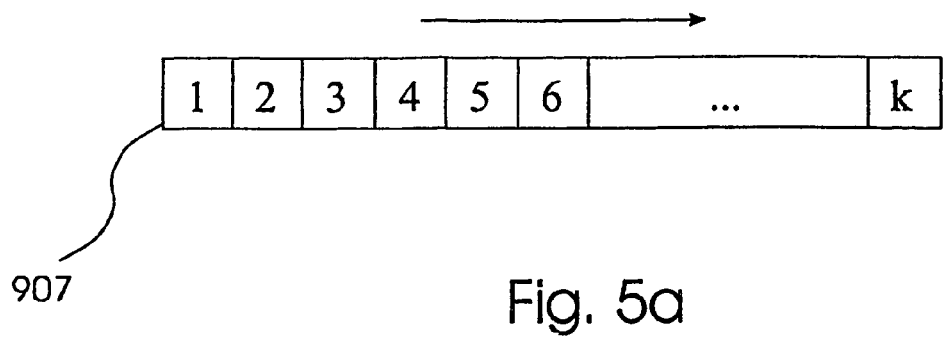

On the other hand, if the beam is not well aligned, as shown for electron beam 101b on the right hand side of FIG. 2a, the focus does not only move in a direction perpendicular to a specimen surface but also in a further direction parallel to the surface. Thus for successive images, additional to the blurring of the image or features, also a translation/shift of the image will be experienced. This is further illustrated in FIG. 2b. A well-focused image feature 502 within the field of view 501 corresponds to the focus condition 503b in FIG. 5a. If a defocusing to the focus 503b is realized, the image feature shifts with respect to the field of view and blurs due to the defocusing. Thus, an image feature will be seen similar to e.g. 502b. On the other hand for a focus according to 503c, the image feature is translated in the opposite direction as illustrated for 502c. Again, this translation is obtained in addition to a blurring.

According to the present invention, the defocusing that causes the translation of the image is obtained by a variation of the beam energy, that is to say by a variation of any potential that influences the energy of the electron beam within the objective lens. According to one embodiment, this variation of the beam energy is applied using the accelerating voltage of the electron gun 103. The power source used for the acceleration voltage has to provide a stable voltage between zero and hundreds, thousands and even several ten thousands volts. The variation of the acceleration voltage, that is to say the modulation range, is between zero and a few hundreds of volts. One criterion given for the acceleration voltage is the stability. Since it is more difficult, to provide a stable power source that can be modulated with at least 10 Hz up to several 100 Hz or 1 kHz, it is advantageous to provide a stable power source for the high voltage up to several 10 kV and to provide a second power source with a modulation range of few hundred volts. Thus, a modulation of a stable acceleration voltage can be provided.

As already mentioned, first aperture alignment deflection unit 110, however, does not shift the beam towards the optical axis 113, but deflects the beam whereby a beam tilt is introduced. That is to say, the angle of the beam, with respect to e.g. an optical axis, changes due to the deflection. This beam deflection is, at least partially, compensated for by the second aperture alignment deflection unit 111. Preferably, second aperture alignment deflection unit 111 tilts the beam at the same angle as the first aperture alignment deflection unit in the opposite direction. This can e.g. be realized by having two similar deflection units and connecting them electrically in a manner that the deflection fields with the same absolute value have the opposite direction. However, the present invention is not limited to similar first and second aperture alignment deflection units 110 and 111. Differences in deflection angles for identical signals applied to the deflection units could also be equalized by correction factors or the like.

According to the present invention, the focusing and defocusing is realized by the variation of energy of the electron beam 101, that is to say by the variation of a potential influencing the energy of the beam within the objective lens 112, and the chromatic aberrations introduced within the objective lens thereby. This is advantageous over a defocusing using the objective lens current. Thereby, the variation of the focus is not limited by self-inductance within the lens. Further, no hysteresis within the objective lens can occur.

Independent of a specific embodiment, it can generally be said that with respect to the different aspects of the present invention, it is preferred that the set of images generated comprises at least 20 images; preferably the set of images generated comprises at least 80 images. Thus, the judgment of the imaging performance for the different focal positions can be conducted more accurate.

A further embodiment uses the generated images or frames respectively to correct for a distortion of the electron beam 101. The electron beam deviates from its ideally circular cross section e.g. due to an astigmatism in the objective lens. This astigmatism can be compensated for by a stigmator. Within the description of astigmatism, the usage of the wording x- or y-direction does not necessarily imply that the two directions are orthogonal to each other. Yet, it is preferred to refer to x- and y-direction as being rotated to each other by 45° if referring to the correction of the astigmatism. The principles of the astigmatism alignment can be better understood when relating to FIG. 3 and FIG. 4.

In the case of astigmatism occurring, a punctual object 801 is not ideally imaged since the focus 809 in the first image plane 803 is not identical to the focus 811 in the second image plane 805. Thus, if the point of best focus 807 is to be found, a compromise must be made. For this reason, the image 808 at the point of best focus has an enlarged diameter. In case of a defocusing, the image of a punctual charged particle beam will not be circular anymore, but will be elliptical. The orientation of the ellipse depends on whether an image plane will be located before or behind the point of best focus 807. In addition, if the image is out of focus, the resolution in the two directions defined by the first and second image plane will be different from each other.

Figure 4:
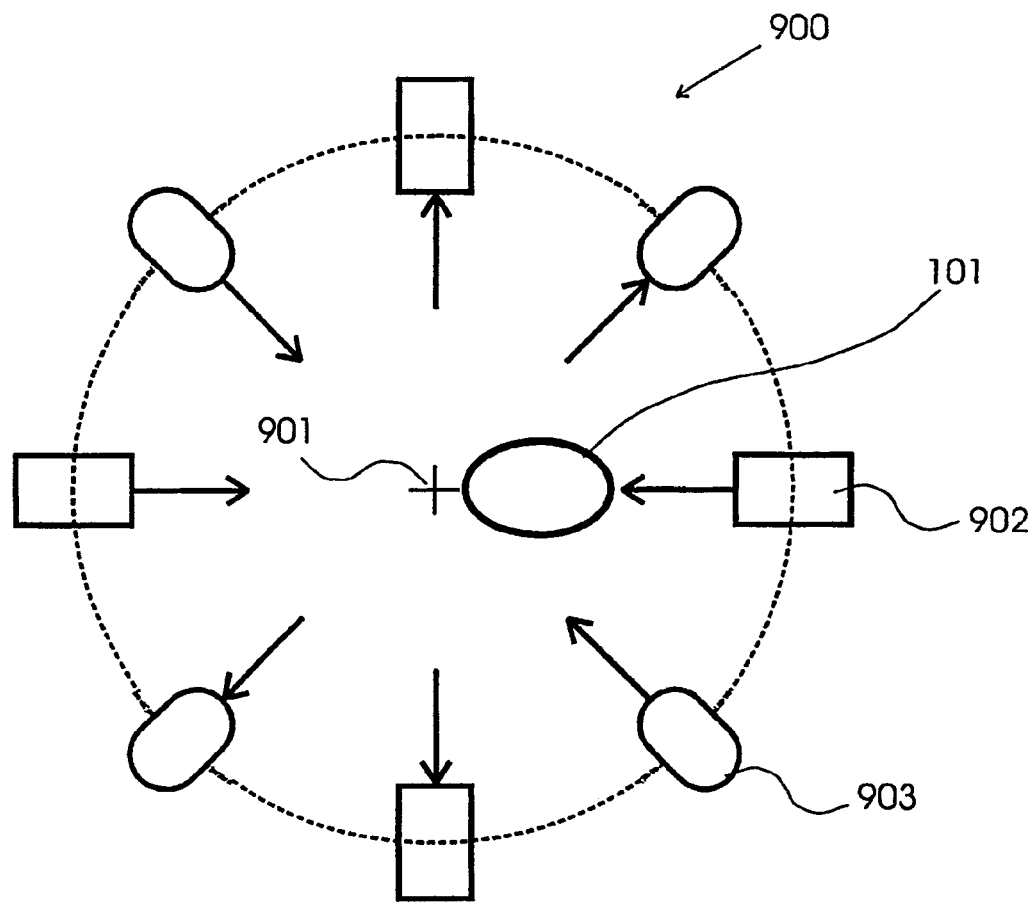
FIG. 4 shows a block diagram of two quadrupole stigmators for two directions combined to an octupole stigmator.

Within an electron beam apparatus, the distortion of the beam is corrected by a stigmator. This is preferably done every time any alignment has been conducted, since the stigmatism changes dependent on the alignment of the electron beam 101 within the electron beam column. The distortion in x-direction is, thereby, corrected for due to the set of coils 902. The set of coils is preferably arranged in form of a quadrupole. In general, coils are used to form the quadrupole. However, also a combination of coils and electrostatic plates can be used. In order to correct in a direction independent to the x-direction preferably a second quadrupole arrangement as a set of coils 903 is used. Thus, a beam distortion can be corrected for, in each direction, by the octupole arrangement formed thereby. However, it is also possible to only use a quadrupole stigmator, which can be rotated to be adjusted to the respective orientation of the distortion of the beam 101. As shown in FIG. 4, the beam does not necessarily pass through the center 901 of the stigmator. Further, if currents are applied to the coils, electrical fields are also generated driving a shift of the electron beam 101. The implication therefrom will be referred to below.

In general, the variation of a potential influencing the beam energy within an objective lens in the form of a ramp, can preferably be used to define the ramp by an initial value, an amplitude and a resolution of the potential influencing the beam energy. Thereby, the resolution of the potential that is influencing the beam energy within the objective lens is preferably optimized by defining the total number of frames or by defining the amplitude of the ramp. Thus, it is possible, in the case that an automated ramp generation does not yield a sufficient result, to automatically generate a sufficient ramp. A sufficient ramp is to be understood as a ramp that allows an automated alignment process. Resolution of the potential that is influencing the beam energy is understood as the potential difference of two consecutive frames.

In general, referring to all value variations in form of a ramp, the following should be considered. It is preferred to apply the variation of e.g. a potential influencing the beam energy within the objective lens in the form of a ramp and the individual frames are generated during one ramp cycle. Such a ramp can advantageously be linear or have a step-like form. Thus, a synchronization of the variation of the potential influencing the beam energy and the image generation can be achieved. This synchronization can, in addition, be advantageously used to average individual frames generated at corresponding image conditions.

With respect to the above, it is preferred that the set of images is generated in a way to obtain quasi-continuous image shifts. It is even more preferred that the image shift between two images of the set of images is less than 10 pixels, preferably less than 5 pixels, more preferably less than 2 pixels. Thus, the preferred algorithms for measuring e.g. a translation of the image or the image features respectively will be more accurate and further, image processing routines will less likely be erroneous. These preferred algorithms for measuring the image shift are based on image processing. Preferably, the image shift is measured using pattern tracking, specifically recursive pattern recognition.

Figure 5B:
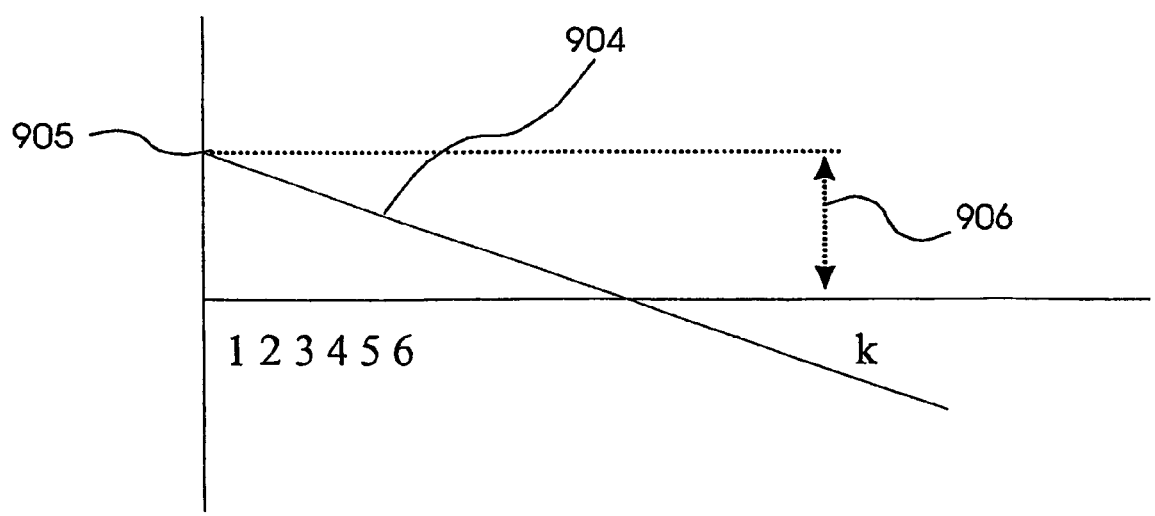

According to one embodiment, it is preferred that the variation in one of the potentials influencing the beam energy of the electron beam within the objective lens and, thereby, introducing a defocusing of the beam is applied in the form of a ramp. It is preferred that the variation is varied around the focal length corresponding to the surface of the specimen. Such a ramp, as shown in FIG. 5*b*, is defined by an amplitude of the ramp 906 and an initial value of the ramp 905. Since the ramp, as shown in FIG. 5*b*, has a constant first derivative, a synchronization of the variation of the energy of the beam and the generation of frames/images is simplified. The duration of the ramp is between 0.5 seconds and 1 sec. Within this time 45 to 90 or more frames are generated. If, for example, a 3 TV-mode is applied, a new frame can be generated about every 11 ms. Due to the synchronization, it is possible to match each frame and the respective frame number 907 with a beam energy. The beam energy on the other hand can be correlated to the distance of the focus with respect to the surface of the sample. Due to this assignment of the amount of defocusing or the beam energy of the electron beam with the number of the frame, several alignment procedures and corrections that are present below can be conducted.

Thus, independently of a specific embodiment, it is preferred if the defocusing takes 1 second or less, preferably if it takes 0.5 seconds or less. Therefore, the total alignment time can be reduced by a factor of 5 to 10 compared to the state of the art.

Defining the variation of the beam energy in the form of a ramp has a further advantage. The different frames generated during one ramp cycle are analyzed with respect to several characteristics. Thereby, the best beam energy value is aimed for. In general, the best beam energy value with respect to any of the characteristics will be an extreme value. In the case no extreme value can be observed, it is likely that the ramp needs to be continued. Such a continuation of electron beam energy in form of a further ramp is simplified by the definition of a ramp using an amplitude and an initial value.

According to one embodiment, the beam energy associated with an optimized focus can be obtained. Thus, the measurements conducted during one ramp cycle can be used for an auto focus system. Thereby, the sharpness of the gained images is evaluated by one of the following procedures.

First, it is possible to calculate the correlation between consecutive frames or specific areas of consecutive frames including individual image features. For a strong defocusing blurring will occur. Thus, there is a lot of noise that is statistically distributed. This leads to a small correlation between two consecutive frames or areas of the consecutive frames respectively. In case of a small defocusing, there will be hardly any blurring. This is, among other things, due to the fact that the electron beam has a so-called DOF (depth of focus) the length around the best focus in direction of the beam propagation in which the beam diameter does not change significantly. Thus, two consecutive frames will show less statistical noise and will be nearly identical. Therefore, the correlation will be large. From the correlation, a so-called focus mark can directly be deduced. Thus, the higher the correlation or the focus mark respectively is, the better the beam will be focus on the specimen. The above-described evaluations can be automated. This yields an automatic focus routine. However, in practice there are some problems that have to be overcome. For example, there is the possibility that the image is shifted from one imaged frame to the next imaged frame within the set of images. This translation, which will be discussed in more detail below, disturbs the correct evaluation of the sharpness based on the correlation. This influence might be ignored if the image translation is less than 2 or 3 pixels. For a shift beyond 2 or 3 pixels, the image shift has to be corrected for. Thus, the above-described procedure can be improved by a measurement of the translation of the image. The shift of an image or a feature of the image can be detected using pattern recognition tools, referred to below. As soon as the shift of a feature is known, the image can be corrected for the calculated shift before the correlation is calculated. Thus, the reliability of the focus mark, as defined above, can be increased.

Second, it is possible to use a statistical evaluation of the sharpness. Thereby, not only individual features of an image, but the entire field of view is evaluated with respect to the contrast. This is done by calculating a histogram of a derivative image. In order to obtain a sharpness that is independent of any orientation of the image, an average value of a directional derivative in x, and y-direction can be used. This evaluation is based on the assumption that a sharp image with less blurring shows more contrast at the edges of all kind of image features. Further to the contrast of edges, noise will contribute to the histogram. From the above it can be expected that a histogram will show a region associated with the noise and a region associated with the contrast of the edges of image features. In the case of a better contrast due to a good focusing, the region associated with the contrast of the edges will be more pronounced if compared to a blurred image having less contrast. The behavior described above can be used for evaluating the sharpness and to gain, again, a focus mark. Since the entire image is statistically evaluated, a shift of the field of view can be neglected as long as enough image features evaluated are randomly distributed over the specimen. Further, the histogram for the first derivative, that is to say the number of sharp edges, can be normalized to the average contrast of the individual frame.

As an example, the system saves 90 frames of images. Then an image processor calculates the average of each 5 successive image frames and calculates the sharpness score in two directions respectively. Thus, there are 18 scores in each direction. Thus, for the present invention at least two sharpness scores for each direction have to be used for calculating a correction signal based on the sharpness scores, more preferably however, there are at least 10 sharpness scores for each direction used for the calculations.

The present invention is to be understood with respect to the sharpness evaluation as not being limited by the above two examples. Any further sharpness evaluation routine can be applied to the present invention.

As mentioned above and described before with respect to FIGS. 2a and 2b, according to a further embodiment, a misalignment of the electron beam with respect to the optical axis leads to image shifts between consecutive frames in case a potential influencing the beam energy is varied and, thereby, the defocusing of the electron beam with respect to the specimen surface is obtained. The dependency of this image shift on the variation of the e.g. acceleration voltage shows a nearly linear behavior. If the observed image shift is known, the beam can be aligned to the optical axis based on a calibration.

Thereby, the image shift can be measured according to the following. The generated frames are sent to a frame grabber and fed to an image processor. The image processor selects one or more characteristics of the image. Thereby, edges having a high contrast and different orientations with respect to the field of view are chosen. A pattern recognition algorithm follows the characteristics of the image and calculates the number of pixels the image characteristics is shifted between consecutive frames. In general, the pattern recognition can be conducted using one of several possibilities like correlation scores to template images, classification, neural networks or other pattern recognition routines. Another optional is, to use a pattern tracking based on recursion. Recursive pattern recognition is advantageous since the shift between consecutive images is in general limited to a view pixels. If a shift from frame number k to frame number k+1 is e.g. less than 10 pixels in each direction of the image, the reliability of a pattern tracking routine can be increased. As a further option, the correlation of the characteristics of individual frames can be compared to the characteristics of one initial frame. Such an initial frame can be the one with the best focus mark. In case of a bad correlation below a certain threshold of an individual frame with the initial frame, the individual frame can be eliminated from further calculations. Thus, it can be avoided that images showing too much blurring will decrease the accuracy of the calculations. As a result, the image shift of each image of the generated set of images can be obtained.

In order to enable a non-iterative alignment of the electron beam with the optical axis, a calibration has to be used. Such a calibration can be done once during manufacturing. However, to increase precision, it is preferred to renew the calibration on a regular basis. A time interval between the renewal of the calibration will most likely depend on the operational and environmental conditions an SEM is used in. A renewal of the calibration could, for example, be conducted once a month.

A calibration of the sensitivity of the aperture alignment, that is to say the alignment of the electron beam with respect to the optical axis, is conducted as follows. First, the SEM is aligned manually as accurate as possible. Thereby, in case a former calibration exists, an operator could be assisted by an automated alignment making use of the old calibration. The next step is conducted at least two times, preferably four times. Thereby, each time a known exact misalignment of the beam is introduced purposely. Afterwards, for each misalignment respectively, a set of calibration frames is generated while a known variation of beam energy of the electron beam is applied. This is e.g. done by modulating the acceleration voltage. An image processor analyzes the set of images and the shift observed for each known misalignment is used as a reference measurement. Based on the known variation of the beam energy, the known misalignment and the measured image shift, the sensitivity of the system can be calibrated for x- and y-direction separately. The factors for the calibration are calculated using e.g. a linear, a polynomial regression model or any other appropriate function. Thereby, a least square fit or minimizing the absolute values to the fitted curve could be used among other fitting routines. Preferably, a linear calibration function is used for the calibration.

Using the calibration, functions for the signal I that has to be applied to the alignment deflection units to align the beam in an adjustment step according to the following can be obtained:

$$I_x(\text{new}) = I_x(\text{present}) + C_{x,sens}\Delta x \quad C_{x,sens} = \frac{\Delta I_x}{\Delta x}$$

$$I_y(\text{new}) = I_y(\text{present}) + C_{y,sens}\Delta y \quad C_{y,sens} = \frac{\Delta I_y}{\Delta y}$$

Thereby, $C_{x(y),sens}$ are the sensitivity factors from the calibration, $\Delta x$ and $\Delta y$ are the image shifts in the respective directions.

If, for the original alignment, a beam tilt in an arbitrary direction with respect to the optical axis occurs, the above equations can be extended. A small beam tilt that is not corrected for can, independent of the alignment deflection unit in x-direction, lead to a image shift in the y-direction and vice versa. Thus, the above equations would than read:

$$I_x(\text{new}) = I_x(\text{present}) + C_{x,sens}\Delta x + C_{xy,sens}\Delta y \quad C_{xy,sens} = \frac{\Delta I_x}{\Delta y}$$

$$I_y(\text{new}) = I_y(\text{present}) + C_{y,sens}\Delta y + C_{yx,sens}\Delta x \quad C_{yx,sens} = \frac{\Delta I_y}{\Delta x}$$

To align the electron beam with respect to the optical axis on a daily basis or even before every new measurement at a different site of a wafer, the set of images generated during the variation of the beam energy can be analyzed with respect to the beam shift. From formerly calibrated sensitivity factors $C_{i,sens}$ the measured beam shifts $\Delta x$ and $\Delta y$ and the variation of the beam energy $\Delta V_{acc}$ the signals $I_x$(new) that have to be applied to the aperture alignment deflection units 110 and 111 for x-direction and the signals Iy(new) that have to be applied to the further aperture alignment deflection units for the y-direction can be calculated. Thus, it is possible to align the electron beam 101 without the necessity for any iteration to the optical axis. However, since the linearity of the dependency of the image shift $\Delta x$, $\Delta y$ from the signal correction might not be valid for very large misalignments, optionally a further alignment step can be conducted.

In general, independently of a specific embodiment, it applies that due to the calibrations, mentioned above, the iterative adjustment, as an operator would conduct it, does not have to be imitated. For this reason it is, per se, not obligatory to have any iteration. Thus, a fast adjustment of the charged particle column can be obtained. Further, if iterations are still performed, a higher accuracy can be obtained with fewer iteration steps. Further, it is preferred if the charged particle beam device is calibrated for different setups. Thereby, a more accurate calibration can be obtained, since corrections that are influenced by any kind of device parameters can be taken into account.

Further, it can generally be said that it is preferred that correction of the position of the beam of charged particles with respect to the optical axis is obtained by moving an aperture. It is even more preferred that the correction of the position of the beam of charged particles with respect to the optical axis is obtained by deflecting the beam of charged particles. Thus, the beam can be automatically aligned to the optical axis of the charged particle device.

Even further, independently of a specific embodiment the following applies: When a beam of charged particles is deflected in a single deflection unit, the beam is additionally tilted. Thereby, two degrees of freedom influencing the alignment of a charged particle beam are coupled to each other. Due to this coupling, the alignment of the beam is complicated. To avoid this, it is preferred for the above method to use a second deflection unit to redirect the beam towards its original direction. It is even more preferred to redirect the beam in a manner to propagate along its original direction.

According to a further embodiment the set of images generated during variation of the beam energy can be used to evaluate the beam distortion. Thus, using a stigmator, as described above with respect to FIG. 4, the astigmatism of the objective lens can be corrected for.

Figure 3:
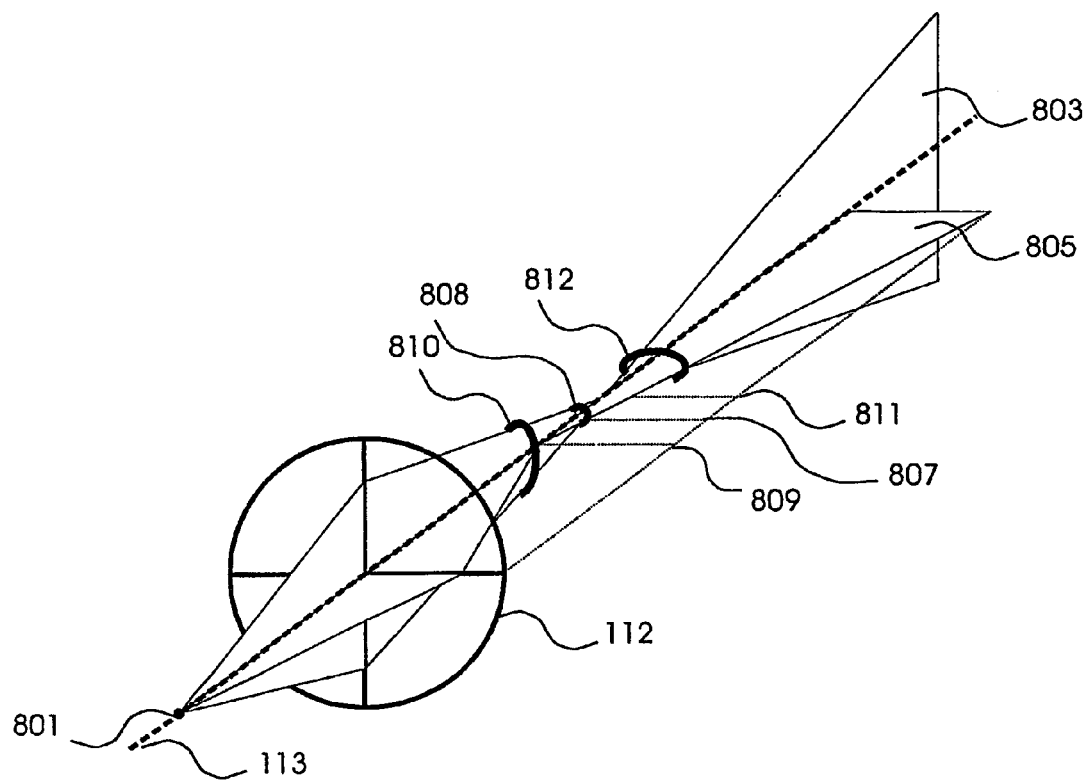
FIG. 3 illustrates the principle of astigmatism.

As described above with respect to FIG. 3, astigmatism leads for a movement of the focus away from the surface of the specimen to a blurring of the image that depends from the direction. As shown in FIG. 3, the beam cross-section for different focal positions changes to an ellipse having a specific orientation. If, comparable to the sharpness evaluation described above, the sharpness of the individual images (at least two images) of the set of images is analyzed orientation dependent, the strength and the orientation of the astigmatism can be evaluated.

The orientation of the sharpness can be specified according to one of the following algorithms. These algorithms are based on the sharpness evaluation described above with respect to the automatic focusing. Comparing consecutive frames, different features having edges with different orientations can be compared. Due to the elliptical shape of the beam with astigmatism, the sharpness of the direction orthogonal to each other will vary. Thus, the sharpness will be analyzed in at least two orthogonal orientations. It is, however, advantageous, if the sharpness is analyzed in four orientations being rotated by an angle of 45°. The strength of the astigmatism is detected by the differences in the focus mark for two different amounts of defocusing. In case a histogram of a first derivative is used for the sharpness evaluation, the first derivative can be calculated for the orientation that has to be investigated. Again, at least two orthogonal orientations have to be evaluated. Preferably, however, four orientations rotated by 45° are evaluated.

A calibration of the current that has to be applied to the stigmator can be calculated analogously to the calibration of the alignment process. In a first approximation, a linear dependency of the current that has to be applied from the amount of defocusing for the respective orientation can be assumed. The amount of defocusing for one orientation can be defined by means of a numerical focus mark. Thereby, the focus mark fin is calculated for one orientation. The difference for the focus marks of two frames having a distinct $\Delta V_{acc}$ is a measure for the amount of astigmatism. Further, as can be seen from FIG. 3, two orthogonal directions correlate with each other. Thus, as mentioned above, the x- and y-direction are rotated with respect to each other by an angle of 45°. From the calibration using a linear regression, functions according to $$I_x^S(\text{new}) = I_x^S(\text{present}) + A_{x,sens}\Delta x + A_{xy,sens}\Delta y \quad A_{xy,sens} = \frac{\Delta I_x}{\Delta y}$$

$$I_y^S(\text{new}) = I_y^S(\text{present}) + A_{y,sens}\Delta y + A_{xy,sens}\Delta x \quad A_{yx,sens} = \frac{\Delta I_y}{\Delta x}$$

are obtained. During the calibration the sensitivity factors $A_{x,ysens}$ are specified. The above equations can then be used during the alignment to correct the stigmator current for x-stigmator 902 and y-stigmator 903.

To summarize the above, according to several aspects and embodiments of the present invention, it is possible to generated a set of images while varying the acceleration voltage or any potential influencing the energy of the electron beam, e.g. in form of a ramp or any other well-defined manner. Such a measurement will take 1 second or less, preferably it will take half a second or less. The set of images will be a sufficiently large number of images, e.g. more than 20 images. From these generated images, an auto focus routine, an alignment of the electron beam with respect to the optical axis and a correction for the astigmatism of the electron beam column can be calculated. The required calculations can use another ½ second. Yet, in a time well below 2 seconds a focusing, an aperture alignment and an astigmatism correction can be conducted. This time is several factors faster than the alignment times used for prior art charged particle column alignment methods. Thus, the method according to the present invention can be used for an adjustment of the column before each site of a wafer is measured. Thereby, high accuracy measurements can be obtained over a long period of time, even though the wafer might show strong surface topology.

Figure 6:
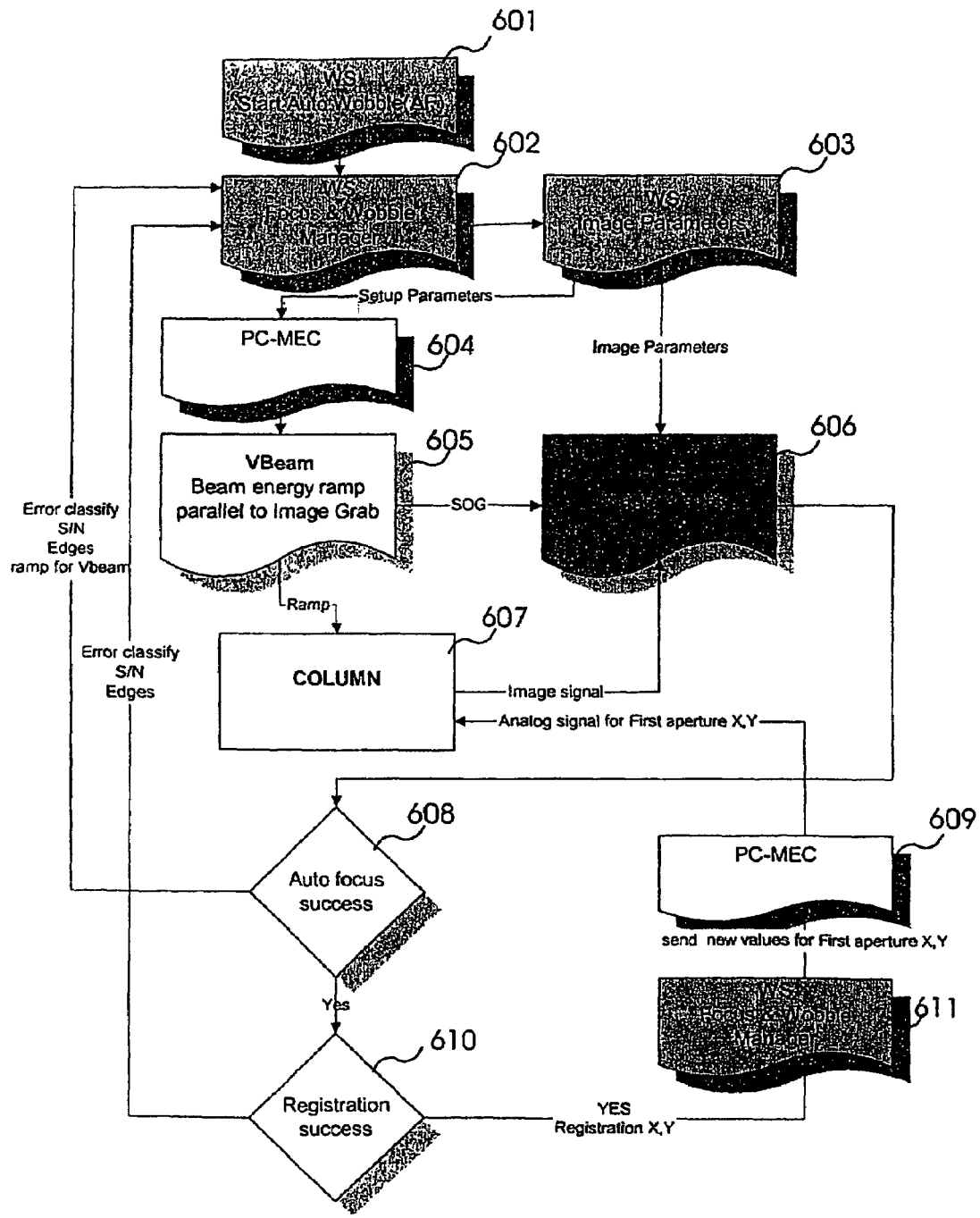
FIG. 6 shows a flow chart of the process according to the present invention.

A flow chart of a method according to some of the embodiments is shown in FIG. 6. From the workstation of the SEM, that is to say the user interface respectively, an operator starts the auto focus routine with or without wobble or auto wobble calibration, see step 601. The focus manager software, see 602, sends to the microscope electronic cage (MEC) and the image processing (IP) computer the setup parameters (see 604) and the image parameters (see 605). MEC sends the parameters for the acceleration voltage ramp to the VBEAM unit (see 605). The VBEAM unit is responsible for generating a linear ramp of the electron beam energy according to its input parameters. Parallel to each other, IP and VBEAM start their operation and the image signals are grabbed by the IP. Thereby, the set of images with the influence of the ramp of the beam energy are obtained. The IP analyzes the generated frames according to the aspects of the embodiments described above. In case the auto focus failed, an error is sent to the workstation. A possible error could, for example, be a focus mark that is below a certain threshold. This would indicate a serious problem of the imaging quality. A further possible example could be focus marks for a wide range of the beam energy that cannot be distinguished well enough. Further, IP 606 calculates the registration of the image shift in x- and y-direction. In case of a failure like an insufficient number of edges within the field of view or insufficient contrast of the frames or other conditions, also a failed status is sent to the workstation. If the evaluation of the alignment procedures succeeds, the registration of x and y, that is the respective image shifts, are sent to the workstation. The workstation calculates the new focus (beam energy) and the values for aperture alignment deflection unit to MEC. MEC, on the other side, provides the respective values to the column.

Thus, the auto focus and the aperture alignment of the system can be adjusted within less than 2 seconds. A further evaluation of the beam distortion can be included in the procedure of FIG. 6 without hardly any time consumption, since no extra measurements are required.

The invention claimed is:

1. A method for the automatic generation of images to align a charged particle beam column, comprising:
   a) introducing a chromatic aberration by varying the energy of a beam of charged particles, wherein a variation of a focus is obtained;
   b) generating a set of images, while varying the energy of the beam of charged particles;
   c) evaluating the sharpness of the set of images in at least two different direction; and
   d) applying a correction signal to a stigmator so that it corrects a beam distortion, wherein a calibration of the stigmator is carried out.

2. The method according to claim 1, further comprising: setting the energy of the beam so that it corresponds to a desired focus.

3. The method according to claim 1, wherein the sharpness of the set of images is evaluated in at least four different directions.

4. The method according to claim 3, wherein the at least four different directions are rotated with respect to each other by 45°.

5. The method according to claim 1, wherein a linear calibration function is used for the calibration of the stigmator.

6. The method according to claim 1, wherein the set of images generated comprises at least 80 images.

7. The method according to claim 1, wherein the variation of focus is completed in 0.5 seconds or less.

8. The method according to claim 1, wherein the automatic generation of images to align the charged particle beam is completed in 0.5 seconds or less.

9. The method according to claim 1, further comprising an iteration.

10. The method according to claim 1, wherein applying the correction signal is conducted in a second direction.

11. The method according to claim 1, wherein the variation of focus is applied in the form of a ramp and the set of images is generated during one ramp cycle.

12. The method according to claim 11, wherein the ramp is linear.

13. The method according to claim 11, wherein the ramp is synchronized with the generation of the set of images.

14. The method according to claim 13, wherein a second set of images is generated during a second ramp and corresponding images of the sets of images are averaged.

15. The method according to claim 11, wherein the ramp is defined by an initial value, an amplitude and a resolution of the energy of the beam of charged particles.

16. The method according to claim 15, wherein the resolution of the energy of the beam of charged particles is defined by defining a total number of frames.

17. The method according to claim 15, wherein the resolution of the energy of the beam of charged particles is defined by defining the amplitude of the ramp.

18. The method according to claim 15, wherein at least two ramps with at least different initial values are used and energy ranges of the energy of the beam of charged particles of the at least two ramps overlap.

19. A method for the automatic generation of images to align a charged particle beam column, comprising:
   a) introducing a chromatic aberration by varying the energy of a beam of charged particles, wherein a variation of a focus is obtained;
   b) generating a set of images, while varying the energy of the beam of charged particles;
   measuring an image shift; and
   correcting the position of the beam of charged particles with respect to an optical axis based on the image shift measured, wherein a calibration of a deflection unit is carried out.

20. The method according to claim 19, wherein a linear calibration function is used for the calibration of the deflection unit.

21. The method according to claim 19, wherein the set of images is generated to obtain quasi-continuous image shifts.

22. The method according to claim 19, wherein the image shift between two successive images of the set of images is less than 2 pixels.

23. The method according to claim 19, wherein the image shift is measured using pattern tracking.

24. The method according to claim 19, wherein the image shift is measured using a recursive pattern recognition.

25. The method according to claim 19, wherein the correction of the position of the beam of charged particles with respect to the optical axis is obtained by moving an aperture.

26. The method according to claim 19, wherein the correction of the position of the beam of charged particles with respect to the optical axis is obtained by deflecting the beam of charged particles using a first deflection unit.

27. The method according to claim 26, wherein a signal is provided to a second deflection unit to redirect the beam of charged particles.

28. The method according to claim 27, wherein the angle of the beam with respect to the optical axis before the first deflection unit is re-established.

29. The method according to claim 28, wherein coils are used within the first and/or second deflection units.

30. The method according to claim 28, wherein electrostatic modules are used within the first and/or second deflection units.

31. A method for automatically correcting the astigmatism of a charged particle beam column, comprising:
  a) introducing a chromatic aberration by varying a potential influencing the energy of the beam of charged particles within an objective lens, whereby a variation of a focus is obtained;
  b) scanning the beam of charged particles over a specimen to generate a set of images, while varying the energy of the beam of charged particles;
  c) calculating scores of the sharpness in at least two different directions and from at least two images of the set of images to quantify a beam distortion;
  d) calculating a correction signal based on at least two different scores of the scores calculated; and
  e) applying the correction signal to a stigmator so that it corrects the beam distortion, wherein a calibration of the stigmator is carried out.

32. A method for automatically aligning a charged particle beam to an optical axis of a charged particle beam column, comprising:
  a) introducing a chromatic aberration by varying a potential influencing the energy of the beam of charged particles within an objective lens, wherein a variation of a focus is obtained;
  b) scanning the beam of charged particles over a specimen to generate a set of images, while varying the energy of the beam of charged particles;
  c) measuring an image shift between at least two different images of the set of images;
  d) calculating a correction signal based on the image shift; and
  e) applying the correction signal to a deflection unit so that the beam is aligned with the optical axis, wherein a calibration of the deflection unit is carried out.

33. The method according to claim 32, wherein the energy of the beam is varied by a modulation of acceleration voltage.

34. A method for the automatic generation of images to align a charged particle beam column, comprising:
  a) introducing a chromatic aberration by varying the energy of a beam of charged particles, wherein a variation of a focus is obtained; and
  b) generating a set of images while varying the energy of the beam of charged particles, wherein the variation of focus, or the generation of a set of images, is completed in 1 second or less.

* * * * *

UNITED STATES PATENT AND TRADEMARK OFFICE
CERTIFICATE OF CORRECTION

PATENT NO. : 7,335,893 B2
APPLICATION NO. : 10/492257
DATED : February 26, 2008
INVENTOR(S) : Pearl It is certified that error appears in the above-identified patent and that said Letters Patent is hereby corrected as shown below:

Column 11, Line 60, please delete "view" and insert --few--;

Column 16, Claim 19, Line 31, please insert --c)-- before measuring;

Column 16, Claim 19, Line 32, please insert --d)-- before correcting;

Column 16, Claim 29, Line 63, please delete "28" and insert --27--;

Column 16, Claim 30, Line 65, please delete "28" and insert --27--.

Signed and Sealed this

Fourteenth Day of September, 2010

David J. Kappos
*Director of the United States Patent and Trademark Office*